United States Patent
Eskridge

(10) Patent No.: US 6,843,666 B2
(45) Date of Patent: Jan. 18, 2005

(54) METHOD AND APPARATUS FOR INSTALLING A SURFACE MOUNT CONNECTOR ON A PRINTED CIRCUIT BOARD

(75) Inventor: Michael W. Eskridge, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 10/463,489

(22) Filed: Jun. 16, 2003

(65) Prior Publication Data

US 2003/0229984 A1 Dec. 18, 2003

Related U.S. Application Data

(60) Provisional application No. 60/388,815, filed on Jun. 14, 2002.

(51) Int. Cl.$^7$ ............................................. H01R 25/00
(52) U.S. Cl. ........................ 439/116; 439/110; 439/119
(58) Field of Search ................................ 428/209, 901; 174/68.5; 439/110, 116, 119

(56) References Cited

U.S. PATENT DOCUMENTS

| | | | | |
|---|---|---|---|---|
| 4,216,350 A | * | 8/1980 | Reid | 174/261 |
| 4,774,760 A | * | 10/1988 | Seaman et al. | 29/840 |
| 5,059,756 A | * | 10/1991 | Henschenp et al. | 219/85.22 |
| 5,060,846 A | * | 10/1991 | Schaeffer et al. | 228/44.7 |

* cited by examiner

Primary Examiner—Cathy F. Lam
(74) Attorney, Agent, or Firm—Moser, Patterson & Sheridan LLP; Thomas F. Lenihan; Francis I. Gray

(57) ABSTRACT

A method and apparatus for manually installing a surface mount connector having at least one ground bar on printed circuit board (PCB). The method and apparatus include inserting a ground bar along a length of a channel of an installation tool, where the channel is sized to receive the ground bar such that a portion of the ground bar extends from the channel. Both the ground bar and installation tool are disposed over a particular area of the PCB, and the tool is used to align the ground bar. The exposed portion of the ground bar is then soldered to the PCB, and the tool is used to repeat the method for the remaining unsoldered portions of the ground bar. The connector is then installed over the soldered ground bar.

12 Claims, 4 Drawing Sheets

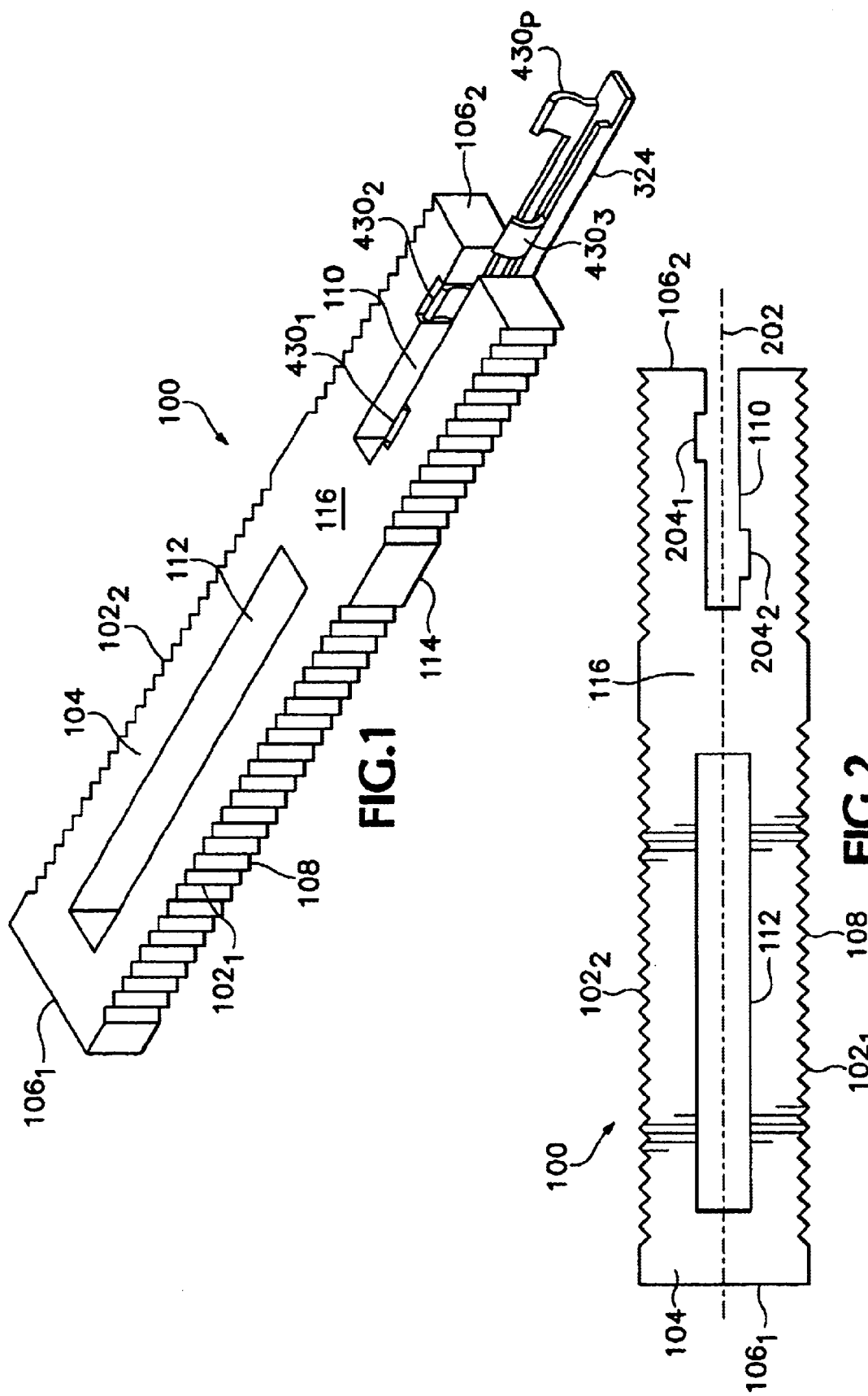

METHOD AND APPARATUS FOR INSTALLING A SURFACE MOUNT CONNECTOR ON A PRINTED CIRCUIT BOARD

CROSS-REFERENCE TO RELATED APPLICATIONS

This patent application claims the benefit of U.S. Provisional Application Ser. No. 60/388,815, filed Jun. 14, 2002, which is incorporated by reference herein in its entirety.

FIELD OF INVENTION

The present invention relates in general to a hand-held tool, and more specifically, to a method and tool for installing surface mount connectors on printed circuit boards.

BACKGROUND OF INVENTION

Various connector manufacturers make several versions of surface mount (SMT) connectors that have an SMT ground plate or bar formed in the center of the connector. Specifically, the body of the SMT connector covers the ground plate such that the ground plate cannot be hand soldered to a printed circuit board (PCB) during installation. As such, repairs to this type of SMT connector on a PCB have to be soldered using an SMT reflow oven to solder the entire connector at once, rather than using hand-held soldering equipment.

However, printed circuit boards requiring repair to the SMT connector may have many other components that are not designed to go through a SMT reflow oven. That is, when a repair is made to attach a new SMT connector having a ground plate, the entire PCB must be placed in the SMT oven, and then the other parts that melted in the SMT oven must also be replaced. Thus, the repair process is not cost effective, and the components on the PCB are subjected to a high temperature cycle in the oven, which can degrade the longevity of the components and the PCB assembly itself. Therefore, there is a need to repair SMT connectors on a PCB in a cost effective manner, and without risking damage or degradation to other components on the PCB.

SUMMARY OF THE INVENTION

The disadvantages heretofore associated with the prior art are overcome by the present invention of a method and apparatus for installing a surface mount (SMT) connector on a printed circuit board (PCB). The method includes removing the ground bars from the body of the connector and inserting a ground bar in an installation tool. Both ground bar and installation tool are disposed over a particular area of the PCB where the ground bar is to be affixed, and the installation tool is used to align the ground bar. An exposed portion of the ground bar is soldered to the PCB, and the tool is used again to repeat the method for the remaining exposed portion of the ground bar. Once the ground bar is completely soldered to the PCB, the connector body is disposed over the ground bar, and its wire leads are then soldered to the solder pads of the PCB.

The installation tool includes a body having an upper surface and a lower surface, and a pair of opposing sidewalls coupled substantially perpendicular to opposing edges of the upper surface, and extending at least to the lower surface. A first channel extends perpendicular through the upper and lower surfaces along a longitudinal axis of the body. The channel is sized to receive a ground bar of a surface mount connector, and the first channel extends through a third sidewall formed perpendicular to the opposing sidewalls, wherein the channel has a length less than a length of the ground bar.

BRIEF DESCRIPTION OF THE DRAWINGS

The teachings of the present invention can be readily understood by considering the following detailed description in conjunction with the accompanying drawings, in which:

FIG. 1 depicts an isometric view of a surface mount connector installation tool of the present invention;

FIG. 2 depicts a top view of the surface mount connector installation tool of FIG. 1;

To facilitate understanding, identical reference numerals have been used, where possible, to designate identical elements that are common to the figures.

DETAILED DESCRIPTION OF THE INVENTION

Figure 3:
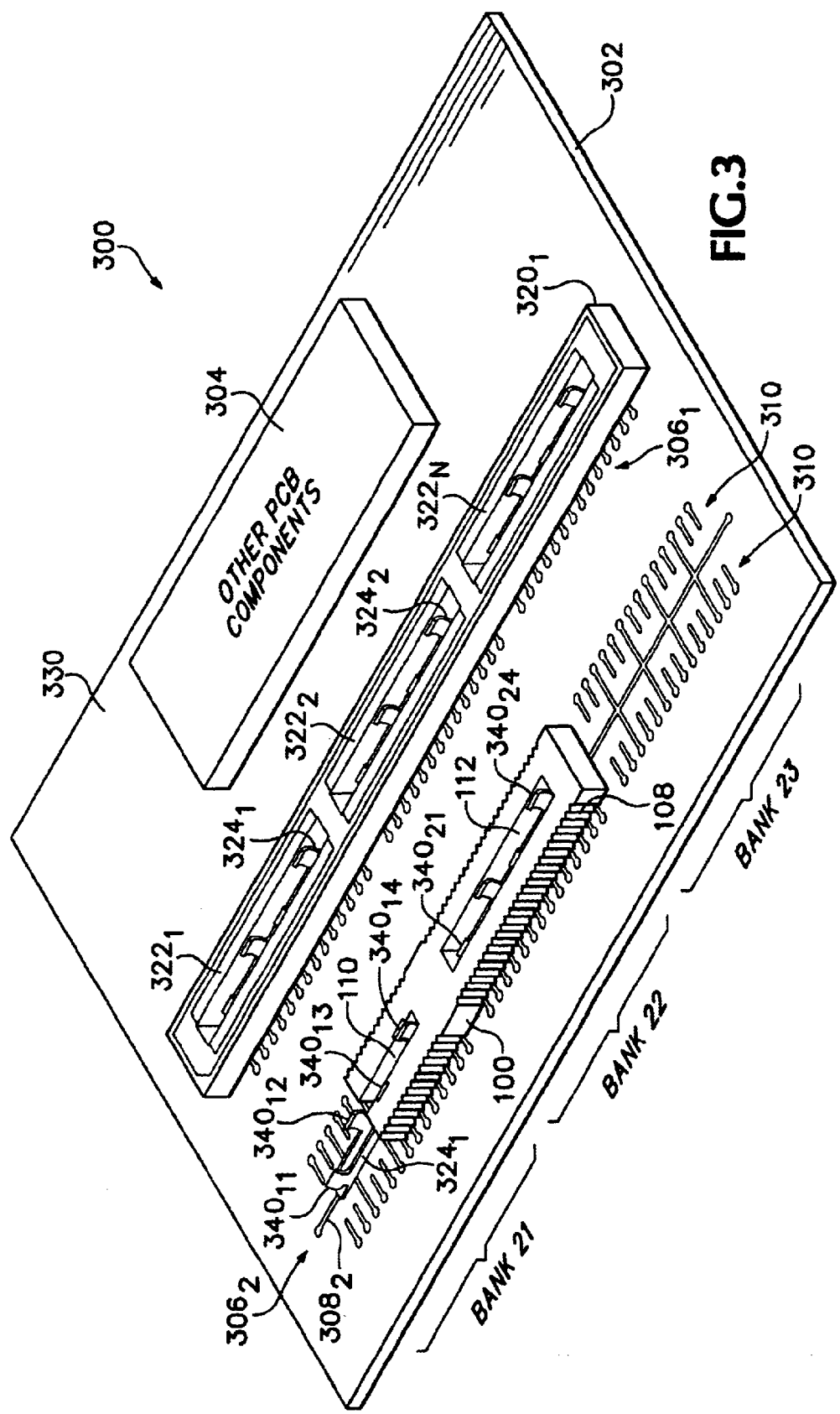
FIG. 3 depicts an isometric view of the surface mount connector installation tool disposed over a surface mount connector on a printed circuit board.

The present invention is a surface mount connector installation tool suitable for use by a technician for manually affixing a ground bar of a surface mount (SMT) connector to a printed circuit board (PCB) during replacement of the SMT connector. As discussed below in further detail, the SMT connector installation tool of the present invention allows the user to align, and then hand solder the ground bar of the SMT connector to the printed circuit board. The body of the SMT connector is then placed over the ground bar after the ground bar is soldered to the PCB. The leads of the SMT connector are then hand soldered to the adjacent solder pads on the PCB. Thus, the SMT connector installation tool of the present invention allows an SMT connector to be manually replaced, without the detrimental effect of unnecessarily exposing other components on the PCB to the high temperatures in a SMT reflow oven.

FIG. 1 depicts an isometric view of a surface mount connector installation tool 100 of the present invention. FIG. 2 depicts a top view of the surface mount connector installation tool of FIG. 1, and should be viewed in conjunction with FIG. 1. The surface mount connector installation tool (hereinafter "installation tool") 100 comprises at least two opposing sidewalls $102_1$ and $102_2$ (collectively opposing sidewalls 102) and an upper surface 104 coupled substantially perpendicular to opposing edges of the opposing sidewalls 102.

In the exemplary embodiment shown in FIGS. 1 and 2, the tool of the present invention is substantially rectangular in shape, where the opposing sidewalls 102 extend a length along longitudinal axis 202 (see FIG. 2). Although the illustrative embodiment is discussed as being substantially rectangular in shape, as will be discussed in further detail below, the length of the tool 100 is dependent on the size of the SMT connector for which the tool 100 is being utilized.

In one embodiment, the tool 100 is shaped as a rectangular block, which is fabricated from a metallic material, such as stainless steel, tungsten, or any other material capable of withstanding temperatures required to solder a connector onto a PCB. Accordingly, the tool 100 is defined by the upper surface 104, a lower surface 114, a first pair of opposing sidewalls 102 extending along the longitudinal axis 202, and a second pair of opposing sidewalls $106_1$ and $106_2$ formed perpendicular to the longitudinal axis 202. The second pair of opposing sidewalls $106_1$ and $106_2$ forms the respective ends of the first pair of opposing sidewalls 102.

The tool 100 further comprises at least one channel 110 extending through the upper and lower surfaces 104 and 114 of the tool 100. The channel 110 is axially aligned with the longitudinal axis 202, and a first end of the channel 110 extends through one of the second opposing sidewalls 106 (e.g., sidewall $106_2$ in FIG. 1). A second end of the channel 110 extends a distance along the longitudinal axis 202 proximate either the other second opposing sidewall $106_1$ or a second channel (e.g., channel 112) formed in the tool 100.

For example, in the embodiment shown in FIGS. 1 and 2, an optional second channel 112 is provided through the upper and lower surfaces 104 and 114 of the tool. The second channel 112 is axially aligned with the longitudinal axis 202, and adjacent to the first channel 110. It is noted that the two exemplary adjacent channels 110 and 112 are separated by portion 116 therebetween.

Referring to FIG. 2, the first channel 110 comprises a plurality of notches 204 extending vertically from the upper surface 104 to the lower surface 114 of the tool. For example a first notch $204_1$ is formed proximate the second opposing end $106_2$, and a second notch $204_2$ is formed adjacent to the first notch $204_1$. The notches 204 are staggered and offset from the longitudinal axis 202. For example, the first notch $204_1$ is formed on one side of the channel 100 parallel to the sidewall $102_2$, while the second notch $204_2$ is formed on the other side of the channel 100 parallel to the sidewall $102_1$. Each notch 204 is sized to receive a respective tab 430 formed on the ground bar 324, as discussed below in further detail with respect to FIGS. 4A–4D.

In order to better understand the inventive tool 100, it is important to understand the type of connector for which the tool 100 is utilized. In particular, the shape and features of the tool 100 are provided to conform to a surface mounted connector having at least one ground bar extending along the length of the connector.

FIG. 3 depicts an isometric view of the surface mount connector installation tool 100 disposed over a surface mount connector 320 on a printed circuit board 302. FIGS. 4A through 4D depict various views of a surface mount connector 320. for which the tool 100 of the present invention pertains. Referring to FIG. 3, a printed circuit board (PCB) 302 comprises various components 304 (e.g., resistors, transistors, integrated circuits, inductors, power supplies, among other conventional electronic components).

The PCB 302 further comprises at least one surface mount (SMT) connector 320, which is illustratively utilized to send and/or receive data and/or power to one or more other PCBs (not shown) or electronic assemblies. The SMT connector 320 comprises one or more banks $322_n$ (where n is an integer greater than zero), and is soldered to the upper surface of the PCB 302 over a respective wire trace 306 comprising a plurality of solder pads 310 and a centered ground trace solder pad 308.

Figure 4A:
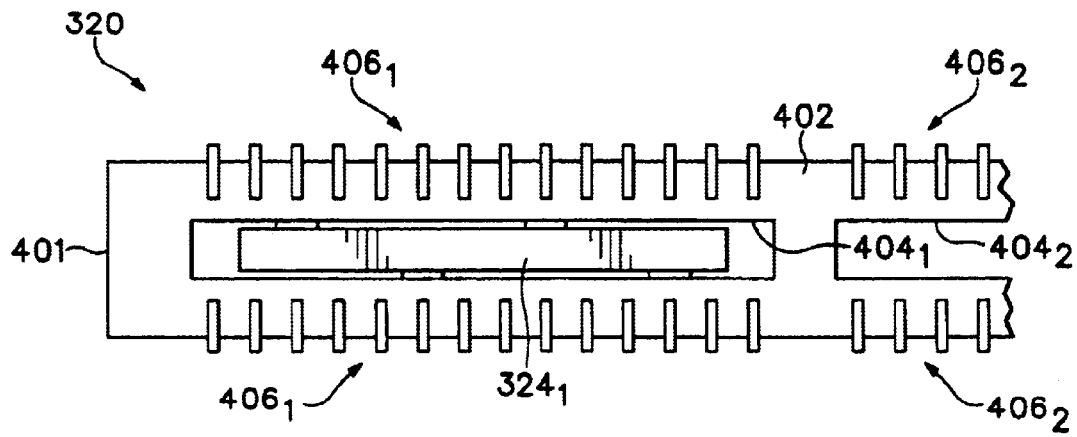
FIGS. 4A through 4D depict various views of a surface mount connector for which the tool of the present invention pertains.
Figure 4B:
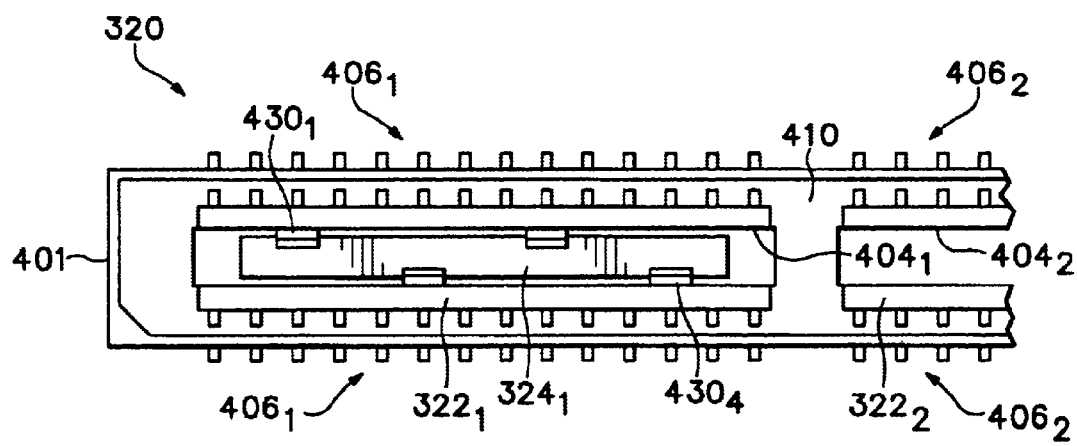

Referring to FIGS. 4A and 4B, a bottom and top view of a multi-bank SMT connector 324 is illustratively shown. The SMT connector 324 comprises a body 401 having a lower surface 402 and an upper surface 410. A slot 404 is formed through the lower and upper surface and extends a length along the center of the body 401. The length and width of the slot 404 is sized to slidably receive the ground bar 324.

Figure 4C:
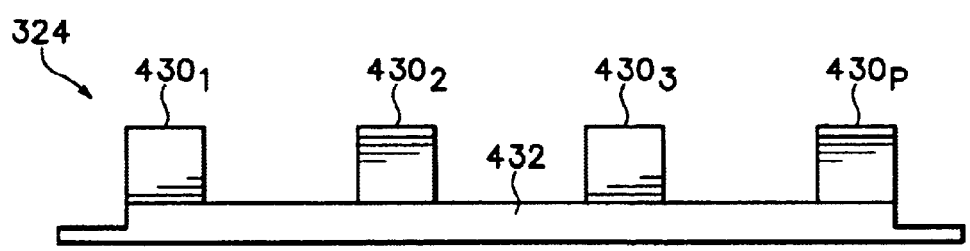
Figure 4D:
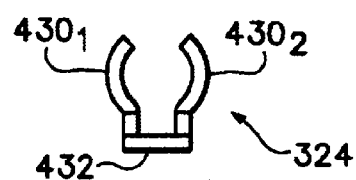

FIG. 4C depicts a side view of a conventional ground bar 324 of the SMT connector 324, while FIG. 4D depicts a front view of the ground bar 324 of FIG. 4C. The ground bar 324 comprises a base 432 having a plurality of tabs $430_p$ (where p is an integer greater than one) vertically coupled to the base 430. In FIG. 4C, four exemplary tabs 430 (i.e., p=4) extend vertically from the base 432, and are spaced equidistant apart. The first and third tabs $430_1$ and $430_3$ are illustratively concave in shape with respect to the second and fourth adjacent tab $430_2$ and $430_p$, and so forth.

The exemplary ground bar 324 is slidably positioned into each slot 404 of each bank 322. For example, ground bar $324_1$ is inserted into a slot 404 of a first bank $322_1$ such that the base 432 is positioned proximate the lower surface 402 of the SMT connector 320. Referring to FIG. 4B, the tabs 430 extend upward from the base 432 within the slot $404_1$.

Furthermore, each bank 322 extends upward from the bottom surface 402 and comprises a plurality of wire leads 406 formed perpendicular to the slot 404 on the bottom surface 402 of the connector 320. Once the connector 320 is positioned over the wire traces 306 on the printed circuit board 302, the plurality of wire leads 406 may be soldered to the respective plurality of solder pads 310. However, since each ground bar 324 is respectively disposed in the slot 404 of each bank 322, a repair technician is unable to access either the ground trace solder pad 308 or the ground bar 324 to perform a soldering process thereto. As discussed below in further detail, the inventive tool 100 allows a repair technician to access and hand solder the ground bar 324 to the ground trace solder pad 308 using, for example, a hand-held soldering iron, prior to installing the body of the connector 320 over the ground bar 324.

Referring to FIGS. 1 and 2, the first channel 110 comprises notches $204_1$ and $204_2$, which conform in shape and size with two adjacent tabs (e.g., tabs $430_1$ and $430_2$). It is noted that the first tab $430_1$ and respective notch $204_1$ are positioned on the side of the channel 110 proximate sidewall $102_1$, while the second tab $430_1$ and respective notch $204_2$ are positioned on the side of the channel 110 proximate the sidewall $102_2$. In one embodiment, the body of the tool 100 has a height approximately equal to the ground bar 324. However, the height of the tool 100 may be less than or greater than the height of ground bar 324, as long as it holds the ground bar perpendicular 324 to the PCB 302.

It is further noted that the first channel 110 has a length that is less than the length of the ground bar 324. Accordingly, a portion of the ground bar 324 is exposed, thereby allowing access by a technician to solder the ground bar to the PCB 302. For example, the exemplary ground bar 324 has a length to accommodate four tabs 430 and their respective spacing therebetween. The exemplary first channel 100 of the tool 100 has a length that retains approximately half of the four-tab ground bar, such that two of the tabs (tabs $430_1$ and $430_2$) are secured in the notches $204_1$ and $204_2$ in the first channel 110. A method 500 for installing the ground bar 324 and connector 320 to a PCB 302 is discussed below in further detail with respect to FIG. 5.

The second channel 112 may be provided to facilitate aligning the tool 100 in an instance where the connector 320 has more than one bank 322. The length of the second channel is sized to conform to the entire length of the second bank $322_2$, as opposed to the first channel 110, which covers only a portion of the first bank $322_1$. For example, the second channel 112 has a length conforming in size to the length of the exemplary ground bar 324 having four tabs 430. In one embodiment, the second channel 112 also has notches (not shown for sake of simplicity) formed in the channel 112, in a similar manner as discussed with respect to the first channel 110. Alternatively, the second channel may be devoid of any notches (as shown in FIGS. 1 and 2), and is sized to receive the four tabs therethrough.

Referring to FIG. 3, a first surface mount connector $321_1$ illustratively having three banks of connectors $322_1$ through $322_3$, is mounted to the upper surface 330 of the printed circuit board 302 over a first wire trace $306_1$. A second wire trace $306_2$ is shown with ground bars $324_1$ and $324_2$ illustratively removed from a second SMT connector (not shown) and disposed on the second ground trace solder pad $308_2$. The second ground trace solder pad $308_2$ extends a length to accommodate a three-bank SMT connector. The first and second ground bars $324_1$ and $324_2$ each have four tabs 430 and respectively form part of the first and second banks 322 of a second SMT connector (not shown) to be mounted on the upper surface 330 of the PCB 302.

The second ground bar $324_2$ is depicted as previously being soldered to the ground trace solder pad $308_2$. The inventive tool 100 is disposed over a portion of the first ground bar $324_1$ and over the entire second ground bar $324_2$, such that only the upper portions of the four tabs $430_{21}$ through $430_{24}$ of the second ground bar $324_2$ are shown in FIG. 3. The third and fourth tabs $430_{13}$ and $430_{14}$ of the first ground bar are respectively positioned within the notches (e.g., notches $204_1$ and $204_2$ of FIG. 2) of first channel 110 of the tool 100, while the first and second tabs $430_{11}$ and $430_{11}$ remain exposed.

Referring to FIGS. 1 and 2, it is noted that a plurality of pitch marks 108 are formed vertically along the sidewalls $102_1$ and $102_2$. The pitch marks 108 are formed adjacent to each other and are spaced to correspond with the pitch between the solder pads 310 of the wire trace 306. Referring to FIG. 3, the pitch marks 108 located on the sidewalls $102_1$ and $102_2$ proximate the second channel 112 are aligned with the solder pads 310 corresponding to a second bank 322 of a SMT connector 320. Similarly, the pitch marks 108 located on the sidewalls $102_1$ and $102_2$ proximate the first channel 110 are aligned with a portion of the solder pads 310 corresponding to another bank 322 of the same SMT connector 320.

Accordingly, the pitch marks 108 align the tool 100 over the trace 306, such that the exposed tabs (e.g., tabs $430_{11}$ and $430_{12}$) are proper aligned with the ground trace solder pad $308_2$. Furthermore, the pitch marks 108 ensure the proper positioning of the ground bar 324 on the ground trace solder pad 308 so that the bank 322 of the connector 320 can be installed thereover the ground bar 324 at the appropriate position on the PCB 302. Moreover, the second channel 112 helps provide proper alignment and spacing between banks 322 in an instance where more than one ground bar 324 is being installed for connector 320 having multiple banks 322.

Once the tool 100 aligns the ground bar 324 to be soldered to the ground trace solder pad 308, a technician may manually solder the base 432 of the exposed portion of the ground bar to the ground trace solder pad 308. The tool 100 may then be rotated 180 degrees, such that the channel 110 is positioned over the portion of the ground bar 324 that has just been soldered, thereby aligning and exposing the unsoldered portion of the ground bar for subsequent soldering to the ground trace solder pad 308. For example, the tool 100 is rotated 180 degrees, such that channel 110 is disposed over tabs $430_{11}$ and $430_{12}$, thereby exposing the unsoldered base portion of the ground bar under tabs $430_{13}$ and $430_{14}$.

Figure 5:
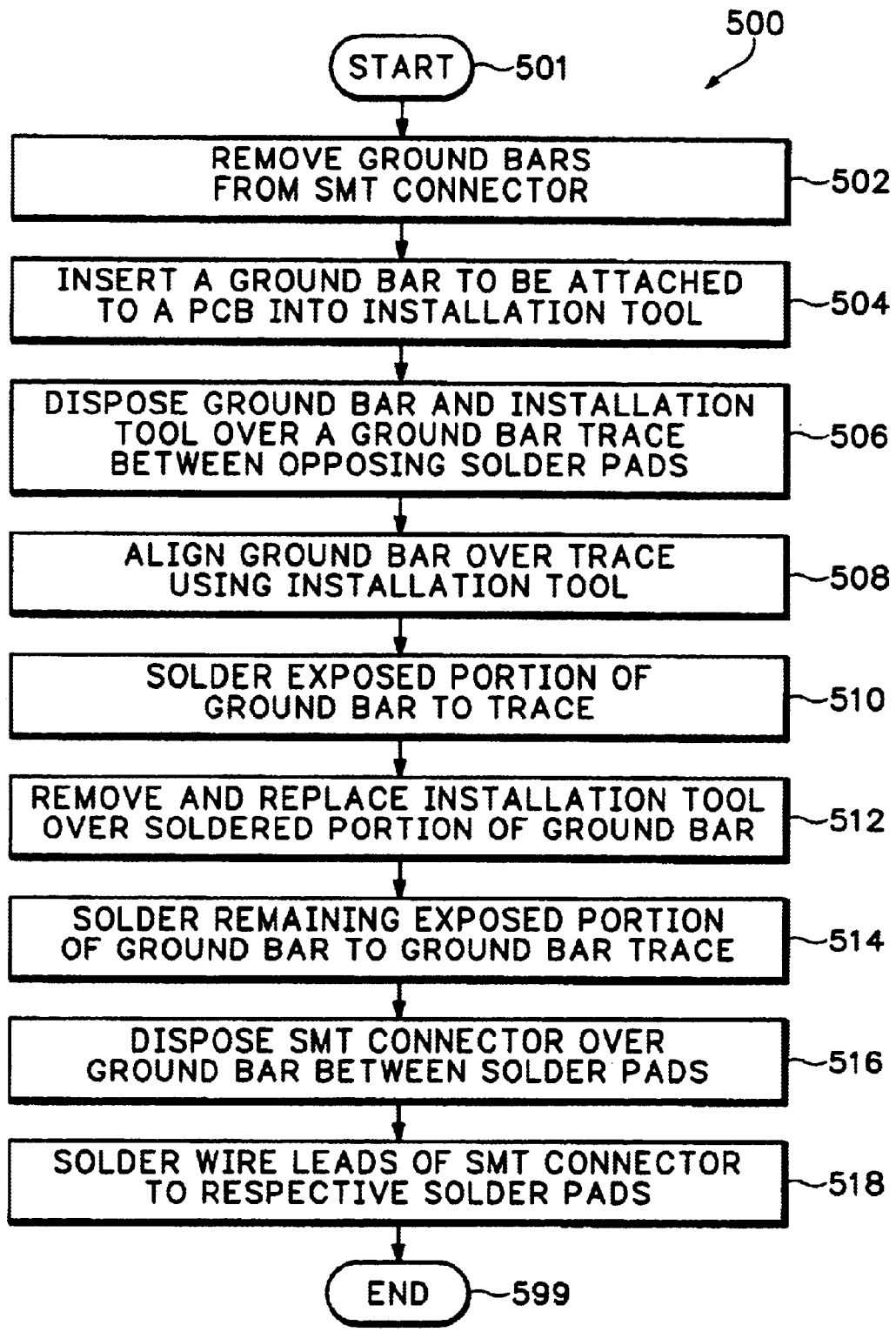
FIG. 5 depicts a flow diagram of a method for installing a surface mount connector to a printed circuit board utilizing the tool of the present invention.

FIG. 5 depicts a flow diagram of a method 500 for installing a surface mount connector 320 to a printed circuit board 302 utilizing the tool 100 of the present invention. The method 500 starts at step 501, where a SMT connector 320 is obtained for replacement on a PCB 302. At step 502, a ground bar 324 from each bank 322 of the connector 320 is removed. Typically, each ground bar 324 may be removed by hand from the slot 404 in each bank 322.

At step 504, a single removed ground bar 324 is inserted into the tool 100. As discussed above with respect to FIGS. 1–4, the channel 110 and respective notches 204 are disposed over a first end of the ground bar 324 and a first portion of the tabs 430, such that a second end of the ground bar (and a second portion of the tabs 430) extend from the tool 100 along the longitudinal axis 202. That is, a portion of the ground bar 324 remains exposed from the tool 100. The method 500 then proceeds to step 506.

Referring to FIG. 3, at step 506, the installation tool and ground bar 324 disposed therein are disposed over a ground trace solder pad 308 where the ground bar 324 is to be attached. In particular, the tool 100 and ground bar 324 are disposed between the respective opposing the solder pads 310 associated with the ground trace solder pad 308. It is noted that the width of the tool 100 is sized to at least contact or overlap the opposing solder pads 308 on a PCB 302 that are associated with a SMT connector 320. Accordingly, the tool 100 retains the ground bar 324 in a vertical position with respect to the ground trace solder pad 308.

At step 508, the ground bar 324 is aligned on the ground trace solder pad 308. In particular, the pitch marks 108 on the opposing sides 102 of the tool are aligned with the solder pads 308. This step 508 ensures that the ground plate 324 is properly aligned with respect to the solder pads on the PCB 302. Furthermore, the ground bar 324 will be centered over the ground trace solder pad 308. The method 500 then proceeds to step 510.

At step 510, the exposed portion of the ground bar 324 extending from the tool 100 is soldered to the ground trace solder pad 308. In particular, the exposed base 432 of the ground bar 324 may be hand soldered to the ground trace solder pad 308.

At step 512, the tool 100 is slidably removed (i.e., lifted) from the ground bar 324. Furthermore, the tool is then placed over the newly soldered portion of the ground bar, such that the portion of the ground bar 324 that was previously inserted in channel 110 is now exposed. For example, referring to FIG. 3, if the ground bar $324_1$ is being soldered to the ground trace solder pad $308_2$, at steps 506–510, the portion of the base 432 below tabs $430_{11}$ and $430_{12}$ would have been previously soldered. At step 512, the tool 100 is lifted off the ground bar $321_1$, rotated 180 degrees, and channel 110 of the tool 100 is disposed over tabs $430_{11}$ and $430_{12}$, thereby exposing the portion of the base 432 under tabs $430_{13}$ and $430_{14}$.

At step 514, the remaining exposed portion of the ground bar 324 is soldered to the ground trace solder pad 308. Specifically, the exposed base 432 of the ground bar 324 may be hand soldered to the ground trace solder pad 308. The installation tool 100 is then removed from the soldered ground bar 324. It is noted that steps 512 and 514 may be applied for ground bars associated with other banks 322 of a SMT connector 320.

At step 516, the body of the SMT connector is disposed over the ground bar 324 (or ground bars) between the opposing solder pads 308. At step 518, the wire leads of the SMT connector are respectively soldered to the solder pads 308. The method 500 then proceeds to step 599, where the SMT installation process is completed and the method 500 ends.

Although the exemplary installation tool 100 has been described as comprising a rectangular body having upper and lower surfaces separated by the height of the opposing sidewalls 102, other embodiments are also envisioned. For example, the installation tool 100 may comprise a single plate forming the upper and lower surfaces. The opposing sidewalls are coupled to opposing edges of the lower surface of the plate along the longitudinal axis 202. A first and optional second channel 110 and 112 may be formed in the plate along the longitudinal axis 202, as well as the pitch marks 108, as discussed above with respect to the embodiment of FIGS. 1–3. Moreover, the second opposing ends $106_1$ and $106_2$ may be eliminated entirely. Thus, the installation tool 100 need only have a first channel 110 having a depth capable of reliably positioning the ground bar in a substantially vertical position with respect to the plate and PCB 302. That is, a portion of the body may be hollowed out between the opposing ends 102, such that the remaining body and channel is capable of retaining the ground bar in the channel 110 without moving or wobbling therein.

The method 500 provides a novel technique that allows a SMT connector to be replaced, illustratively, during a repair action. Moreover, during the repair action, the inventive installation tool 100 facilitates retaining, aligning, and exposing a portion of a ground bar 324, such that the exposed portion may be hand soldered to a ground trace solder pad 308 on the printed circuit board 302. Thus, the SMT connector may be manually replaced during a repair procedure, without the detrimental consequences that arise when using a reflow SMT oven to solder the connector.

Although various embodiments that incorporate the teachings of the present invention have been shown and described in detail herein, those skilled in the art can readily devise many other varied embodiments that still incorporate these teachings.

What is claimed is:

1. A surface mount connector installation tool, comprising:
   a body having an upper surface and a lower surface;
   a pair of opposing sidewalls coupled substantially perpendicular to opposing edges of the upper surface and extending at least to the lower surface;
   a first channel extending perpendicular through the upper and lower surfaces along a longitudinal axis of the body, the channel sized to receive a ground bar of a surface mount connector, wherein the channel has a length less than a length of the ground bar to allow for hand soldering of the ground bar to a printed circuit board.

2. The tool of claim 1, wherein the body is substantially rectangular in shape.

3. The tool of claim 1, wherein the opposing sidewalls comprise a plurality of pitch marks, the pitch marks spaced to a pitch of a respective plurality of solder pads formed on the printed circuit board (PCB).

4. The tool of claim 1, wherein the first channel comprises a plurality of notches extending through the upper and lower surfaces.

5. The tool of claim 4, wherein each notch of the plurality of notches is offset from an adjacent notch, and the notches are sized to accommodate a plurality of tabs extending from the ground bar.

6. The tool of claim 1, further comprising a second channel formed adjacent to the first channel along the longitudinal axis.

7. The tool of claim 6, wherein the second channel is sized to receive a second ground bar.

8. The tool of claim 7, wherein the second channel comprises a plurality of notches extending through the upper and lower surfaces.

9. The tool of claim 8, wherein each notch of the plurality of notches is offset from an adjacent notch, and the notches are sized to accommodate a plurality of tabs extending from the second ground bar.

10. The tool of claim 1 wherein the body is fabricated from a metallic material having a melting point greater than a melting point of solder.

11. The tool of claim 1, wherein the body has a height approximately equal to the ground bar.

12. A surface mount connector installation tool, comprising:
   a rectangular body having an upper surface and a lower surface;
   a pair of first opposing sidewalls coupled substantially perpendicular to opposing edges of the upper surface and extending at least to the lower surface;
   a pair of second opposing sidewalls formed perpendicular to the first pair of opposing sidewalls;
   a channel extending perpendicular through the upper and lower surfaces along a longitudinal axis of the body, the channel sized to receive a ground bar of a surface mount connector, the channel extending through a one of the second opposing sidewalls, wherein the channel has a length less than a length of the ground bar to allow for hand soldering of the ground bar to a printed circuit board.

* * * * *